(12) United States Patent
Bae et al.

(10) Patent No.: US 10,407,298 B2
(45) Date of Patent: Sep. 10, 2019

(54) MICROELECTROMECHANICAL SYSTEMS AND METHOD OF MANUFACTURING THE SAME

(71) Applicant: Advanced Semiconductor Engineering Korea, Inc., Paju-Si, Gyeonggi-Do (KR)

(72) Inventors: Soonheung Bae, Paju-Si (KR); Hoguen Yoon, Paju-Si (KR); Kyunghwan Sul, Paju-Si (KR); Dukyung Kim, Paju-Si (KR)

(73) Assignee: ADVANCED SEMICONDUCTOR ENGINEERING KOREA, INC., Paju-si (KR)

( * ) Notice: Subject to any disclaimer, the term of this patent is extended or adjusted under 35 U.S.C. 154(b) by 0 days.

(21) Appl. No.: 15/663,646

(22) Filed: Jul. 28, 2017

(65) Prior Publication Data

US 2019/0031501 A1   Jan. 31, 2019

(51) Int. Cl.
*B81B 7/00* (2006.01)
*H01L 29/84* (2006.01)
*H01L 23/02* (2006.01)

(52) U.S. Cl.
CPC ............ *B81B 7/0048* (2013.01); *H01L 29/84* (2013.01); *H01L 23/02* (2013.01)

(58) Field of Classification Search
CPC ....... H01L 23/02; H01L 29/84; B81B 7/0061; B81B 7/0032; B81B 7/0074; B81B 7/0077; B81B 2201/0257; B81B 2201/0264; B81B 2201/0278; B81B 2203/0315; B81B 2203/0323; B81B 2203/033; B81B 2203/0338; B81B 2203/0346; B81B 2203/0353
See application file for complete search history.

(56) References Cited

U.S. PATENT DOCUMENTS

| | | | |
|---|---|---|---|
| 6,713,864 B1 * | 3/2004 | Huang | H01L 23/4334 257/692 |
| 7,675,180 B1 * | 3/2010 | St. Amand | B81C 1/0023 257/777 |
| 7,875,942 B2 * | 1/2011 | Cortese | B81B 7/0061 257/415 |
| 7,898,043 B2 * | 3/2011 | Ziglioli | B81B 7/0061 257/414 |
| 7,998,774 B2 * | 8/2011 | Ziglioli | B81B 7/0061 438/51 |
| 8,043,881 B2 * | 10/2011 | Cortese | B81B 7/0061 438/51 |

(Continued)

FOREIGN PATENT DOCUMENTS

| | | | | |
|---|---|---|---|---|
| EP | 3210934 A1 * | 8/2017 | ........... | B81B 7/0038 |
| GB | 2546830 A * | 8/2017 | ........... | B81B 7/0061 |

*Primary Examiner* — Earl N Taylor
(74) *Attorney, Agent, or Firm* — Foley & Lardner LLP; Cliff Z. Liu (57) ABSTRACT

The present disclosure relates to an electronic device. The electronic device comprises a substrate, a micro-electromechanical systems (MEMS) device and an attachment element. The substrate defines an opening penetrating the substrate. The MEMS device has an active surface facing away from the substrate and a sensing region facing toward the opening. The attachment element is disposed on the substrate and surrounding the opening and the sensing region of the MEMS device.

10 Claims, 9 Drawing Sheets

(56) References Cited

U.S. PATENT DOCUMENTS

| | | | | |
|---|---|---|---|---|
| 8,546,895 B2 * | 10/2013 | Cortese | B81B 7/0061 | 257/415 |
| 8,618,619 B1 * | 12/2013 | Miks | H04R 1/021 | 257/414 |
| 9,013,011 B1 * | 4/2015 | Kuo | H01L 27/04 | 257/415 |
| 9,475,691 B1 * | 10/2016 | Chua | B81B 7/0064 | |
| 9,613,877 B2 * | 4/2017 | Suthiwongsunthorn | H01L 24/45 | |
| 9,701,534 B2 * | 7/2017 | Lin | B81B 7/007 | |
| 9,758,372 B1 * | 9/2017 | Kuo | B81C 1/00333 | |
| 2007/0040231 A1 * | 2/2007 | Harney | B81B 7/007 | 257/415 |
| 2008/0150104 A1 * | 6/2008 | Zimmerman | B81B 7/0064 | 257/676 |
| 2008/0164543 A1 * | 7/2008 | Ziglioli | B81B 7/0061 | 257/415 |
| 2008/0179697 A1 * | 7/2008 | Cortese | B81B 7/0061 | 257/415 |
| 2009/0218668 A1 * | 9/2009 | Zhe | B81C 1/00301 | 257/680 |
| 2010/0090295 A1 * | 4/2010 | Zhe | B81B 7/007 | 257/415 |
| 2010/0284553 A1 * | 11/2010 | Conti | B81B 7/0061 | 381/174 |
| 2011/0005326 A1 * | 1/2011 | Bentley | G01L 19/148 | 73/754 |
| 2012/0032285 A1 * | 2/2012 | Cortese | B81B 7/0061 | 257/416 |
| 2013/0069180 A1 * | 3/2013 | Umeda | H04R 19/04 | 257/416 |
| 2013/0129133 A1 * | 5/2013 | Inoda | H04R 19/04 | 381/337 |
| 2013/0223023 A1 * | 8/2013 | Dehe | B81B 7/0029 | 361/752 |
| 2014/0003632 A1 * | 1/2014 | Reinisch | H04R 19/005 | 381/174 |
| 2014/0084396 A1 * | 3/2014 | Jenkins | B81B 3/0021 | 257/419 |
| 2015/0041931 A1 * | 2/2015 | Szczech | B81B 7/0029 | 257/416 |
| 2015/0102478 A1 * | 4/2015 | Suthiwongsunthorn | H01L 24/45 | 257/680 |
| 2016/0167948 A1 * | 6/2016 | Holliday | B81B 7/0029 | 428/212 |
| 2016/0214857 A1 * | 7/2016 | Lin | B81B 7/007 | |
| 2016/0276545 A1 * | 9/2016 | Mueller | H01L 33/486 | |
| 2017/0217760 A1 * | 8/2017 | Piechocinski | B81B 7/0061 | |
| 2017/0217762 A1 * | 8/2017 | Hoekstra | B81B 7/0061 | |
| 2017/0247249 A1 * | 8/2017 | Duqi | B81B 7/0038 | |
| 2017/0260043 A1 * | 9/2017 | Lin | B81B 7/007 | |
| 2017/0275152 A1 * | 9/2017 | Ziglioli | H01L 24/97 | |
| 2017/0294401 A1 * | 10/2017 | Suthiwongsunthorn | H01L 24/45 | |

\* cited by examiner

MICROELECTROMECHANICAL SYSTEMS AND METHOD OF MANUFACTURING THE SAME

BACKGROUND

1. Technical Field

The present disclosure relates to a semiconductor package device including a microelectromechanical system (MEMS) and method of manufacturing the same.

2. Description of the Related Art

MEMS (as used herein, the term "MEMS" may be used to refer to a singular microelectromechanical system or to a plurality of microelectromechanical systems) can be used in semiconductor devices to detect a signal (such as sound, movement or motion, pressure, gas, humidity, temperature, and the like) and to transform the detected signal to an electrical signal. Semiconductor devices (e.g., semiconductor devices using MEMS) have become progressively more complex. The trend is driven at least in part by the demand for smaller sizes and enhanced processing speeds. At the same time, there is a demand to further miniaturize many electronic products containing these semiconductor devices. It may be desirable in some cases to reduce the space occupied by MEMS on a substrate of a semiconductor device, and to simplify and combine packaging, board manufacturing, and assembly processes applicable to the semiconductor device and the substrate.

In a comparative MEMS pressure sensor package, a MEMS die is usually connected to the substrate by flip-chip technique. However, due to the inconsistent diameters of solder balls, the MEMS die may tilt, which may reduce the performance of the MEMS die. In addition, the adhesive applied between the MEMS die and the substrate may flow into a sensing opening (penetrating the substrate), which may also affect the performance of the MEMS pressure sensor.

SUMMARY

In some embodiments, according to one aspect of the present disclosure, an electronic device comprises a substrate, a micro-electromechanical systems (MEMS) device and an attachment element. The substrate defines an opening penetrating the substrate. The MEMS device has an active surface facing away from the substrate and a sensing region facing toward the opening. The attachment element is disposed on the substrate and surrounding the opening and the sensing region of the MEMS device.

In some embodiments, according to one aspect of the present disclosure, an electronic device comprises a substrate, a MEMS device and an attachment element. The substrate has a first surface and a second surface opposite to the first surface. The substrate defines an opening penetrating the substrate and a recess on the first surface of the substrate. The MEMS device has an active surface facing away from the substrate and a sensing region facing toward the opening. The attachment element surrounds the opening and the sensing region of the MEMS device. A portion of the attachment element is within the recess.

In some embodiments, according to one aspect of the present disclosure, an electronic device comprises a substrate, a MEMS device, a support bar and an attachment element. The substrate defines an opening penetrating the substrate. The MEMS device has an active surface facing away from the substrate and a sensing region facing toward the opening. The support bar is disposed between the MEMS device and the substrate. The support bar surrounds the opening of the substrate. The attachment element surrounds the support bar.

BRIEF DESCRIPTION OF THE DRAWINGS

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
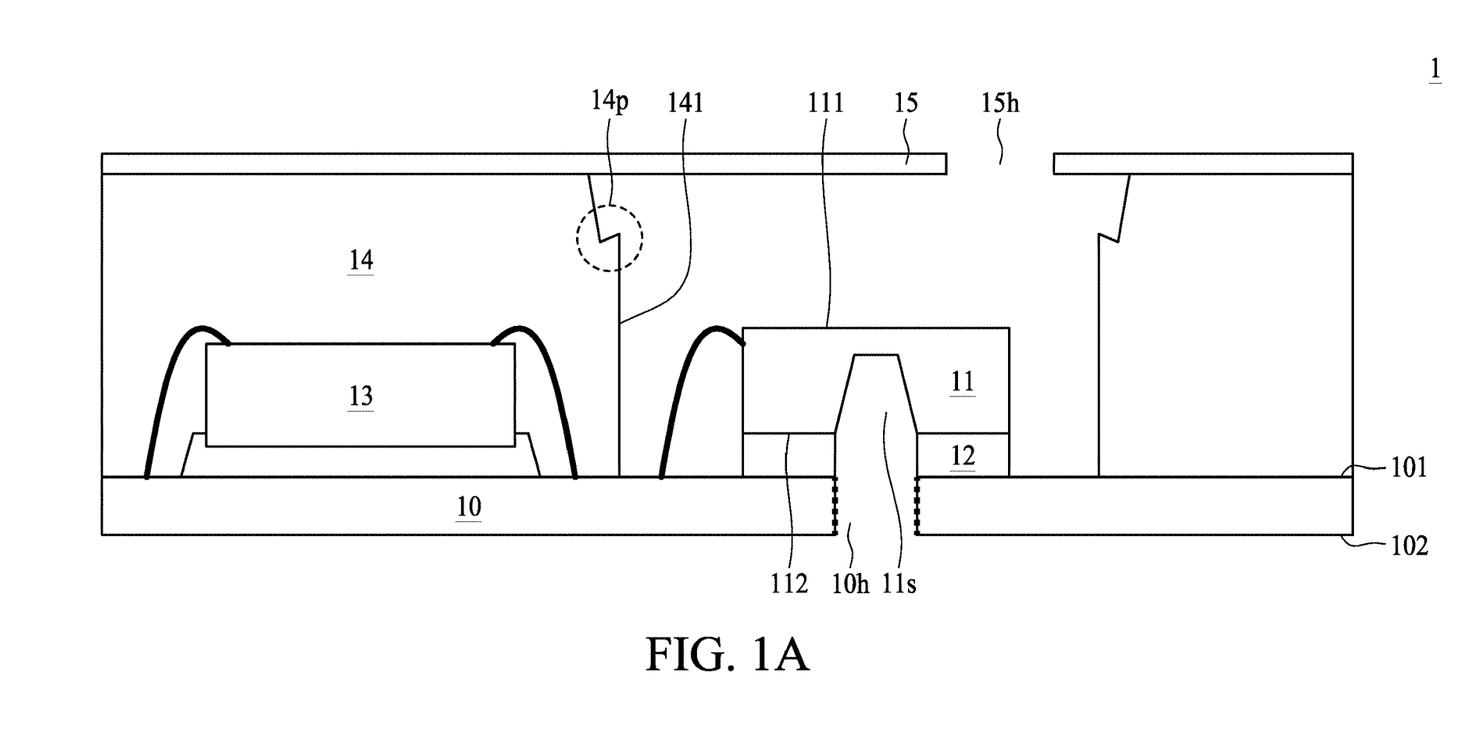
FIG. 1A illustrates a cross-sectional view of a semiconductor package device in accordance with some embodiments of the present disclosure.

FIG. 1A illustrates a semiconductor package device 1 in accordance with some embodiments of the present disclosure. The semiconductor package device 1 includes a substrate 10, a MEMS device 11 (or abbreviated as MEMS 11), an attachment element 12, an electronic component 13, a package body 14 and a metal lid 15.

The substrate 10 may be, for example, a printed circuit board (PCB), such as a paper-based copper foil laminate, a composite copper foil laminate, a polymer-impregnated glass-fiber-based copper foil laminate, or a combination of two or more thereof. The substrate 10 may include an interconnection structure, such as a redistribution layer (RDL) or a grounding element. The substrate 10 has a surface 101 and a surface 102 opposite to the surface 101. In some embodiments, the surface 101 of the substrate 10 is referred to as a top surface or a first surface, and the surface 102 of the substrate 10 is referred to as a bottom surface or a second surface. The substrate 10 defines an opening 10h penetrating the substrate 10.

The MEMS 11 is disposed on the substrate 10 and across the opening 10h of the substrate 10. The MEMS has an active surface (also referred to as active side) 111 facing away the substrate 10 and a back surface (also referred to as back side) 112 opposite to the active surface 111. In some embodiments, the MEMS 11 includes a sensing region (also referred to as sensing region) 11s on the back surface 112 of the MEMS 11 to receive at least one physical signal from environment (e.g., sound, pressure, temperature, humidity, gas, and the like) and to convert the received physical signal to an electrical signal (e.g., for subsequent processing). In some embodiments, the MEMS 11 can be, e.g., a pressure sensor, a microphone, a barometer, a thermometer, a hygrometer, a gas detector, and the like. The sensing region 11s of the MEMS 11 faces toward the opening 10h of the substrate 10. In some embodiments, the sensing region 11s of the MEMS 11 is substantially aligned with the opening 10h of the substrate 10, such that any displacement between a center of the sensing region 11s and a center of the opening 10h is no greater than 1 μm, no greater than 5 μm, or no greater than 10 μm. In some embodiments, the MEMS 11 is electrically connected to the substrate 10 through one or more bonding wires.

Figure 1B:
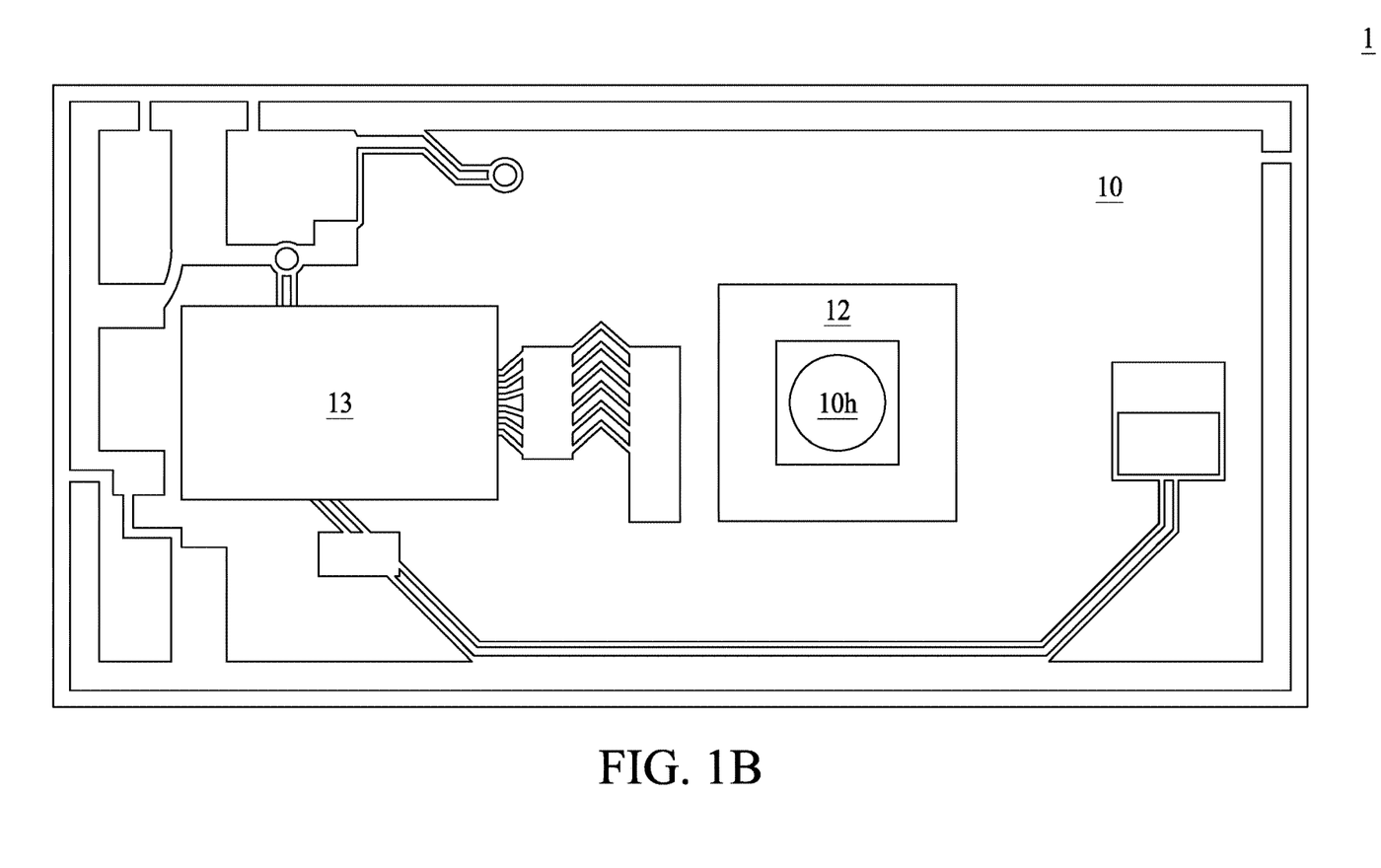
FIG. 1B illustrates a bottom view of a semiconductor package device in accordance with some embodiments of the present disclosure.

The attachment element 12 is disposed between the substrate 10 and the MEMS 11 to attach the MEMS to the substrate 10. That is, the attachment element 12 is disposed between the top surface 101 of the substrate 10 and the back surface 112 of the MEMS 11. As shown in FIG. 1A and FIG. 1B, which illustrates a bottom view of the semiconductor package device 1 in FIG. 1A, the attachment 12 surrounds the opening 10h of the substrate 10 and the sensing region 11s of the MEMS 11. In some embodiments, the material of the attachment element 12 is selected to absorb mechanical stress between the MEMS 11 and the substrate 10. For example, the attachment element 12 is selected from silicon soft adhesive material, B-stage silicon soft adhesive material, other elastomeric material, or a combination thereof.

The electronic component 13 is disposed on the top surface 101 of the substrate 10. The electronic component 13 may be an active component, such as an integrated circuit (IC) chip or a die. In some embodiments, the electronic component 13 may be an application-specific integrated circuit (ASIC). The electronic component 13 may be electrically connected to the top surface 101 of the substrate 10 by way of flip-chip or wire-bond techniques.

The package body 14 is disposed on at least a portion of the top surface 101 of the substrate 10 to cover or encapsulate the electronic component 13. The MEMS 11 and the attachment element 12 are exposed from the package body 14. For example, the package body 14 may define a cavity to accommodate the MEMS 111. As shown in FIG. 1A, a sidewall 141 of the cavity may include a protrusion portion 14p. In some embodiments, the package body 14 includes, e.g., an epoxy resin having fillers, a molding compound (e.g., an epoxy molding compound or other molding compound), a polyimide, a phenolic compound or material, a material with a silicone dispersed therein, or a combination of two or more thereof.

The metal lid 15 is disposed on the package body 14. The metal lid 15 defines a hole 15h to expose the MEMS 11. In some embodiments, the metal lid 15 is a conductive thin film, and may include, for example, aluminum (Al), copper (Cu), chromium (Cr), tin (Sn), gold (Au), silver (Ag), nickel (Ni) or stainless steel, another metal, or a mixture, an alloy, or other combination of two or more thereof. The metal lid 15 can provide electromagnetic interference (EMI) shielding for the electronic component 13 and the MEMS 11.

In a comparative MEMS package, a MEMS die is usually connected to the substrate by flip-chip technique. However, due to the inconsistent diameters of solder balls, the MEMS die may tilt, which may reduce the performance of the MEMS die. In addition, the adhesive applied between the MEMS die and the substrate may flow into a sensing opening (penetrating the substrate), which may also affect the performance of the MEMS die. In accordance with the embodiments shown in FIGS. 1A and 1B, by using wire bonding technique to connect the MEMS 11 to the substrate 10, the tilt issue of the MEMS 11 can be solved. In addition, a robust dam bar (e.g., attachment element 12) disposed around the sensing opening (e.g., the opening 10h of the substrate 10) can prevent the adhesive from flowing into the sensing hole and release the mechanical stress between the MEMS 11 and the substrate 10.

Figure 2A:
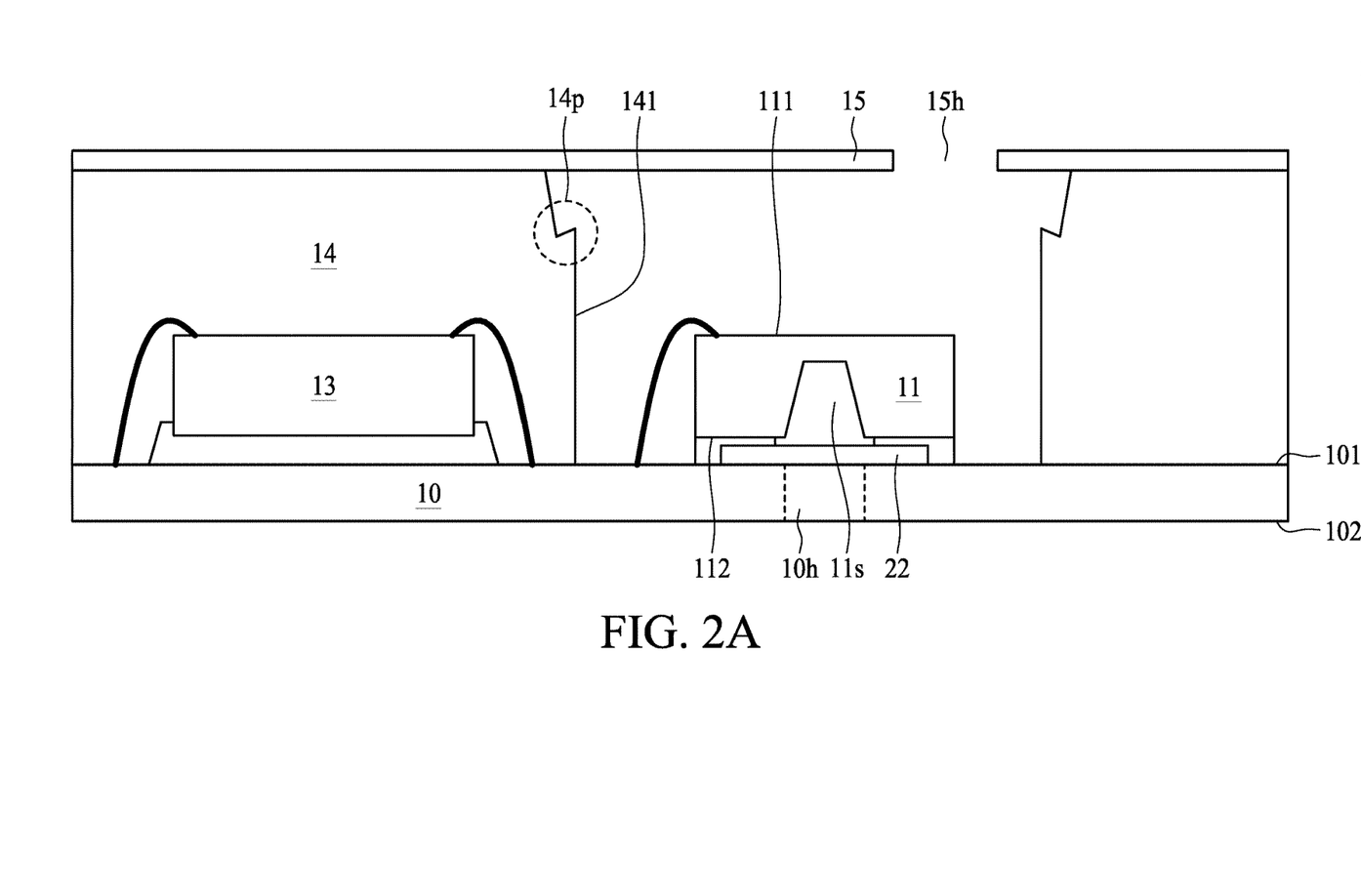
FIG. 2A illustrates a cross-sectional view of a semiconductor package device in accordance with some embodiments of the present disclosure.

FIG. 2A illustrates a semiconductor package device 2 in accordance with some embodiments of the present disclosure. The semiconductor package device 2 is similar to the semiconductor package device 1 shown in FIG. 1A except that the semiconductor package device 2 further includes a stage 22.

The stage 22 is disposed on the substrate 10 and between the MEMS 11 and the substrate 10. In some embodiments, a portion of the attachment element 12 is disposed between the MEMS 11 and the stage 22. In some embodiments, a thickness of the attachment element 12 is greater than a thickness of the stage 22. For example, the thickness of the attachment element 12 is about 100 micrometer (μm) while the thickness of the stage 22 is about 30 μm. In some embodiments, the stage 22 is formed of, or includes, solder resist. In some embodiments, the attachment element 12 may be formed of, or include, one or more soft adhesive materials. For example, the attachment element 12 may be in a liquid form and dispensed on the substrate 10.

In accordance with the embodiments shown in FIGS. 2A and 1B, control over the thickness of the attachment element 12 is facilitated when a support structure (e.g., stage 22) is disposed between the substrate 10 and the adhesive element 12, because the stage 22 can have less tolerance in thickness in case that the attachment element 12 is relatively thick.

Figure 2B:
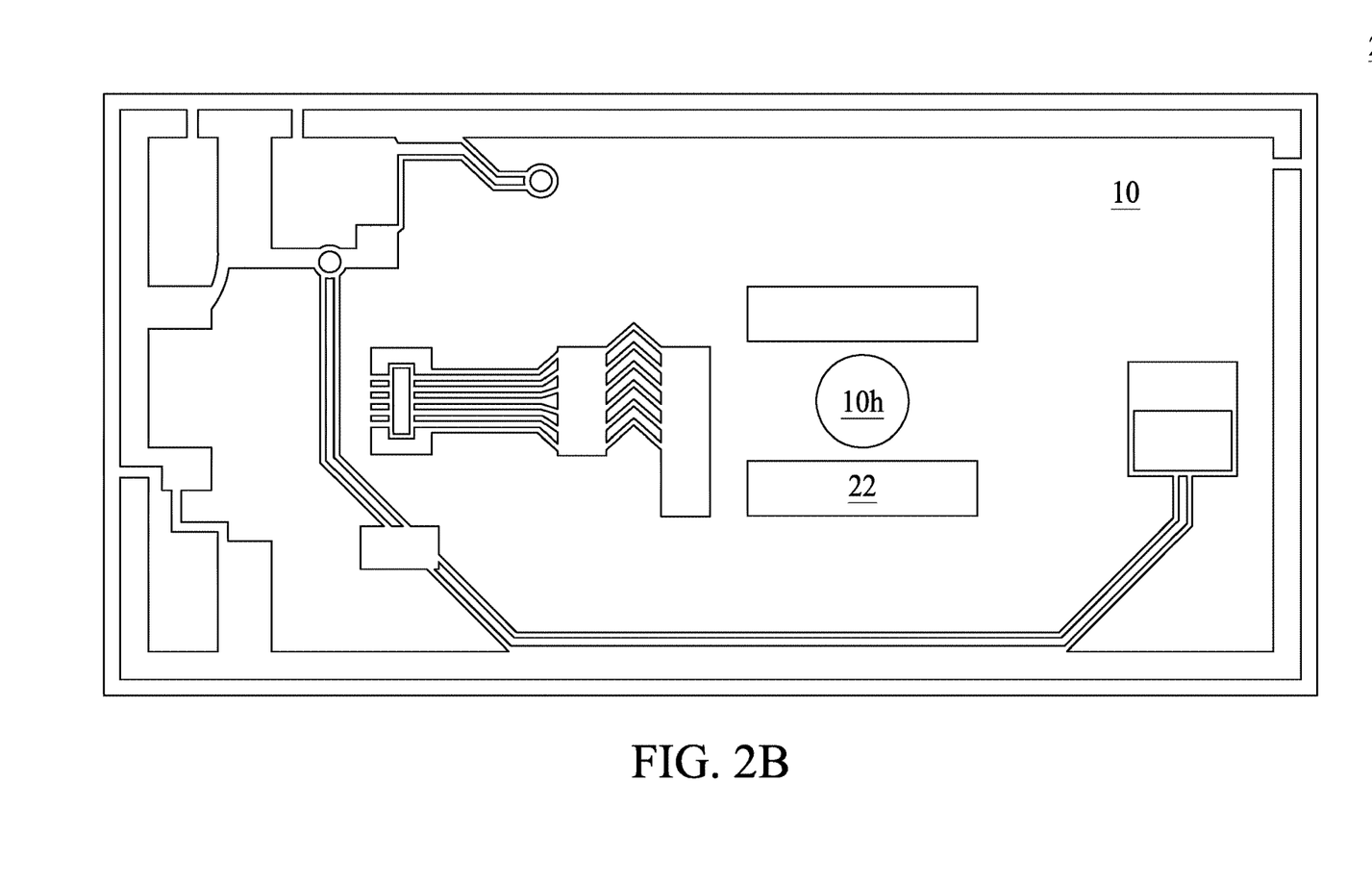
FIG. 2B illustrates a bottom view of a semiconductor package device in accordance with some embodiments of the present disclosure.
Figure 2C:
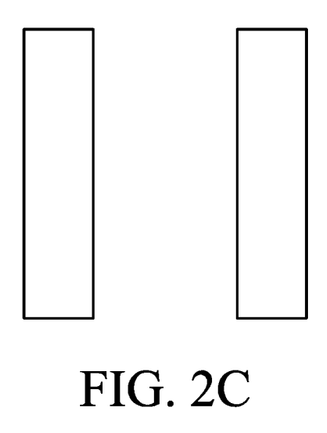
FIG. 2C illustrates one or more types of stage of the semiconductor package device of FIG. 2B in accordance with some embodiments of the present disclosure.
Figure 2D:
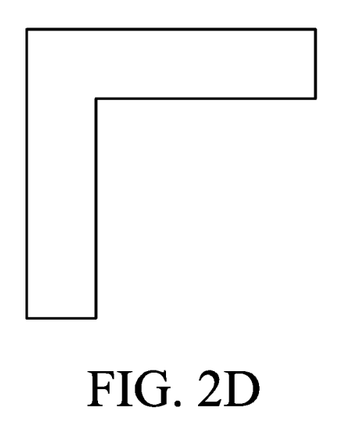
FIG. 2D illustrates one or more types of stage of the semiconductor package device of FIG. 2B in accordance with some embodiments of the present disclosure.
Figure 2E:
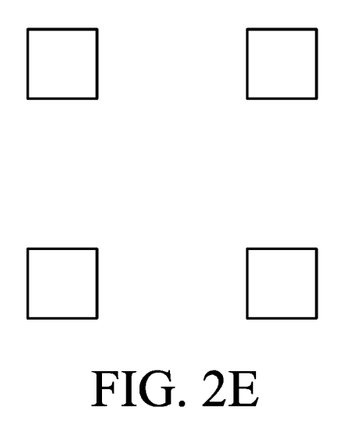
FIG. 2E illustrates one or more types of stage of the semiconductor package device of FIG. 2B in accordance with some embodiments of the present disclosure.

As shown in FIG. 2B, which illustrates a bottom view of the semiconductor package device 2 in FIG. 2A, the stage 22 is adjacent to the opening 10h. In some embodiments, the stage 22 is in a shape of, e.g., multiple parallel bars (e.g., two parallel bars as shown in FIG. 2C), an L-shaped bar (as shown in FIG. 2D) or multiple blocks (e.g., four blocks as shown in FIG. 2E) on four edges of the MEMS 11.

Figure 3A:
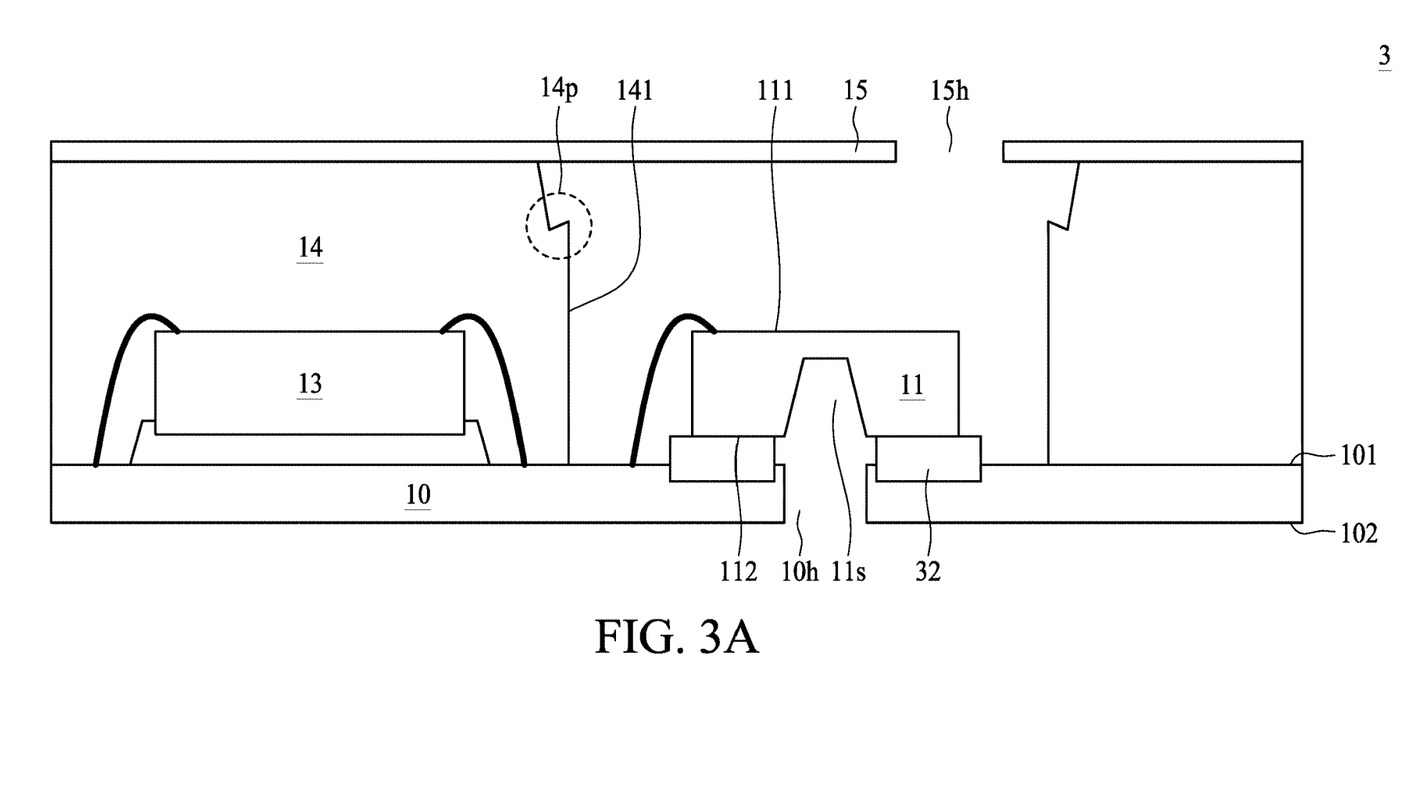
FIG. 3A illustrates a cross-sectional view of a semiconductor package device in accordance with some embodiments of the present disclosure.

FIG. 3A illustrates a semiconductor package device 3 in accordance with some embodiments of the present disclosure. The semiconductor package device 3 is similar to the semiconductor package device 1 shown in FIG. 1A except that in the semiconductor package device 2, a portion of the attachment element 32 is within the substrate 10.

Figure 3B:
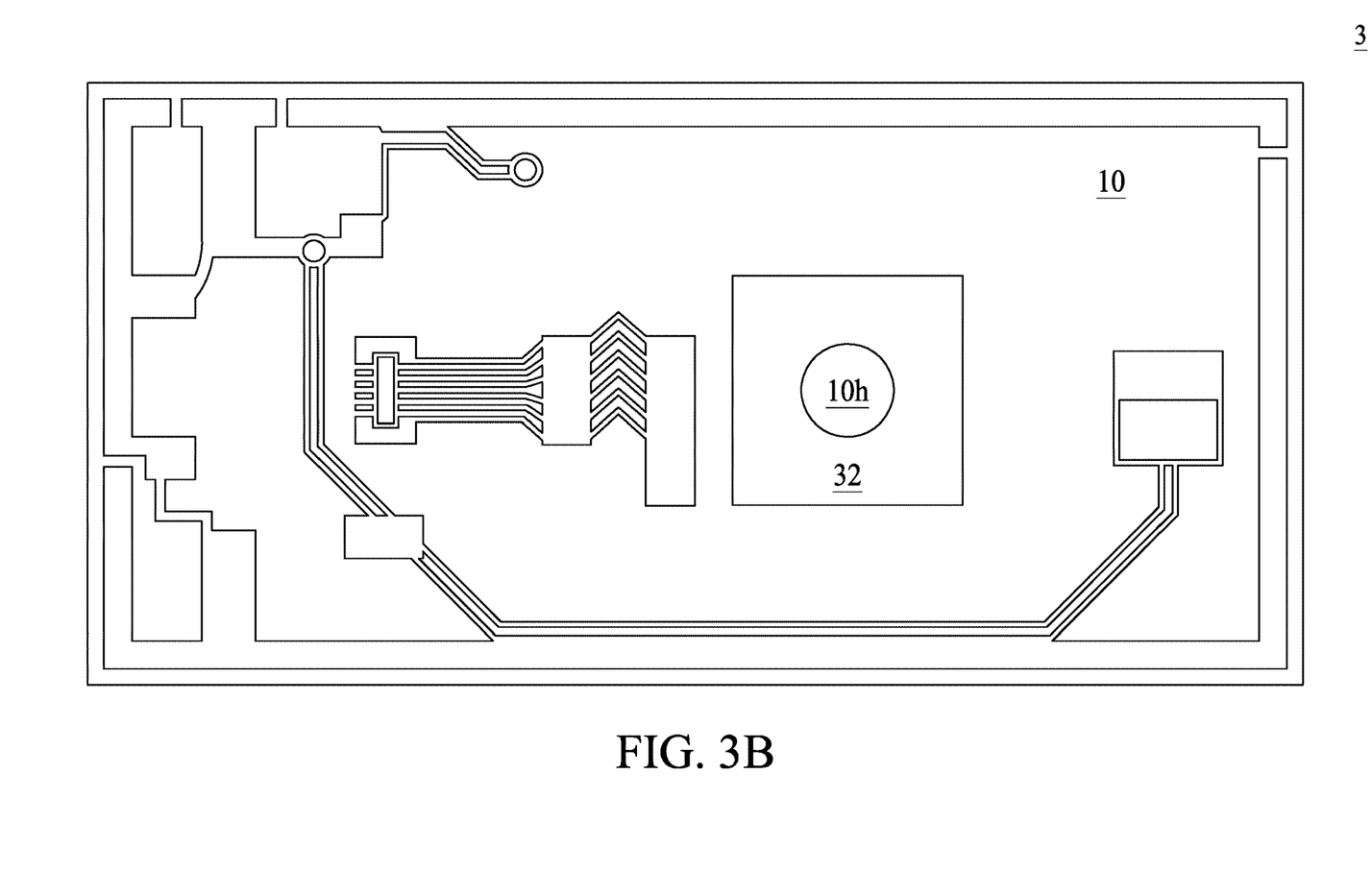
FIG. 3B illustrates a bottom view of a semiconductor package device in accordance with some embodiments of the present disclosure.

The substrate 10 has a recess on the first surface 101 of the substrate 10. The recess is adjacent to and surrounds the opening 10h of the substrate 10. At least a portion of the attachment element 32 is disposed within the recess of the substrate 10. Therefore, as shown in FIG. 3B, which illustrates a bottom view of the semiconductor package device 3 in FIG. 3A, the attachment element 32 surrounds the opening 10h of the substrate 10. Forming the recess around the opening 10h of the substrate 10 can prevent the attachment element 12 from flowing into the opening 10h.

Figure 4A:
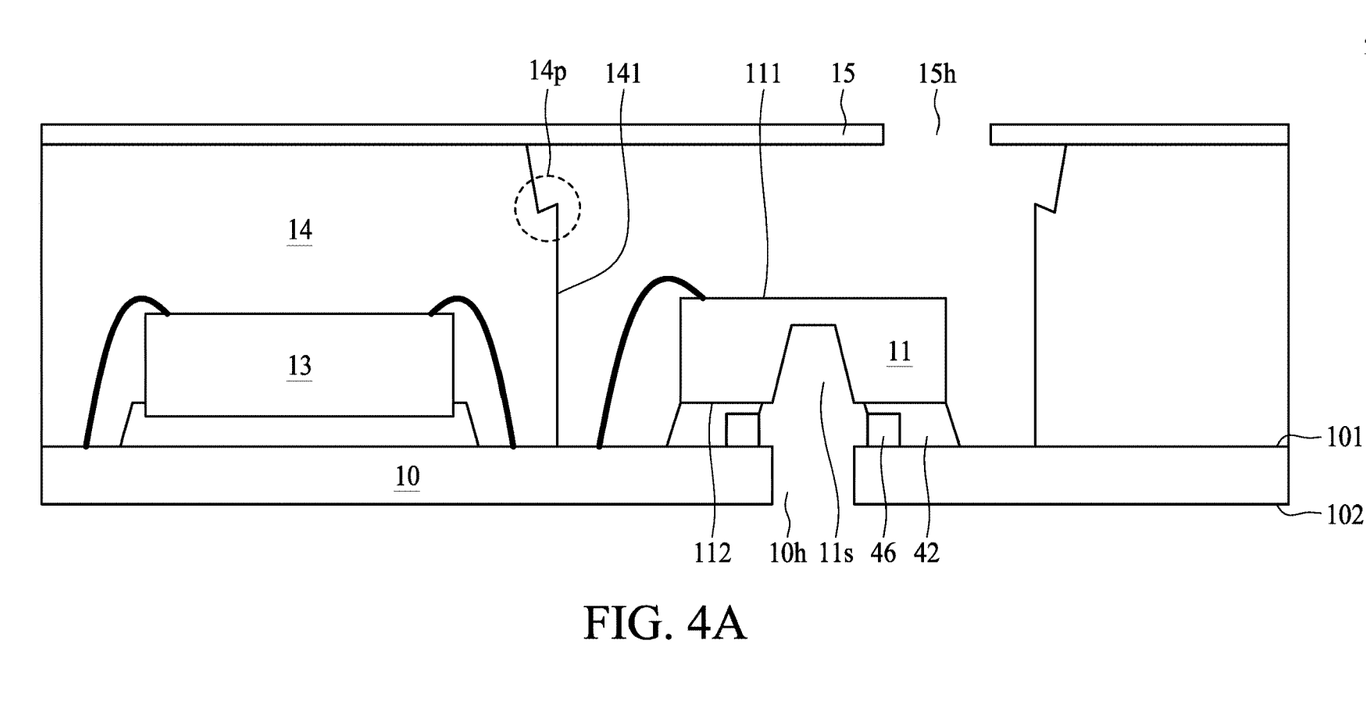
FIG. 4A illustrates a cross-sectional view of a semiconductor package device in accordance with some embodiments of the present disclosure.
Figure 4B:
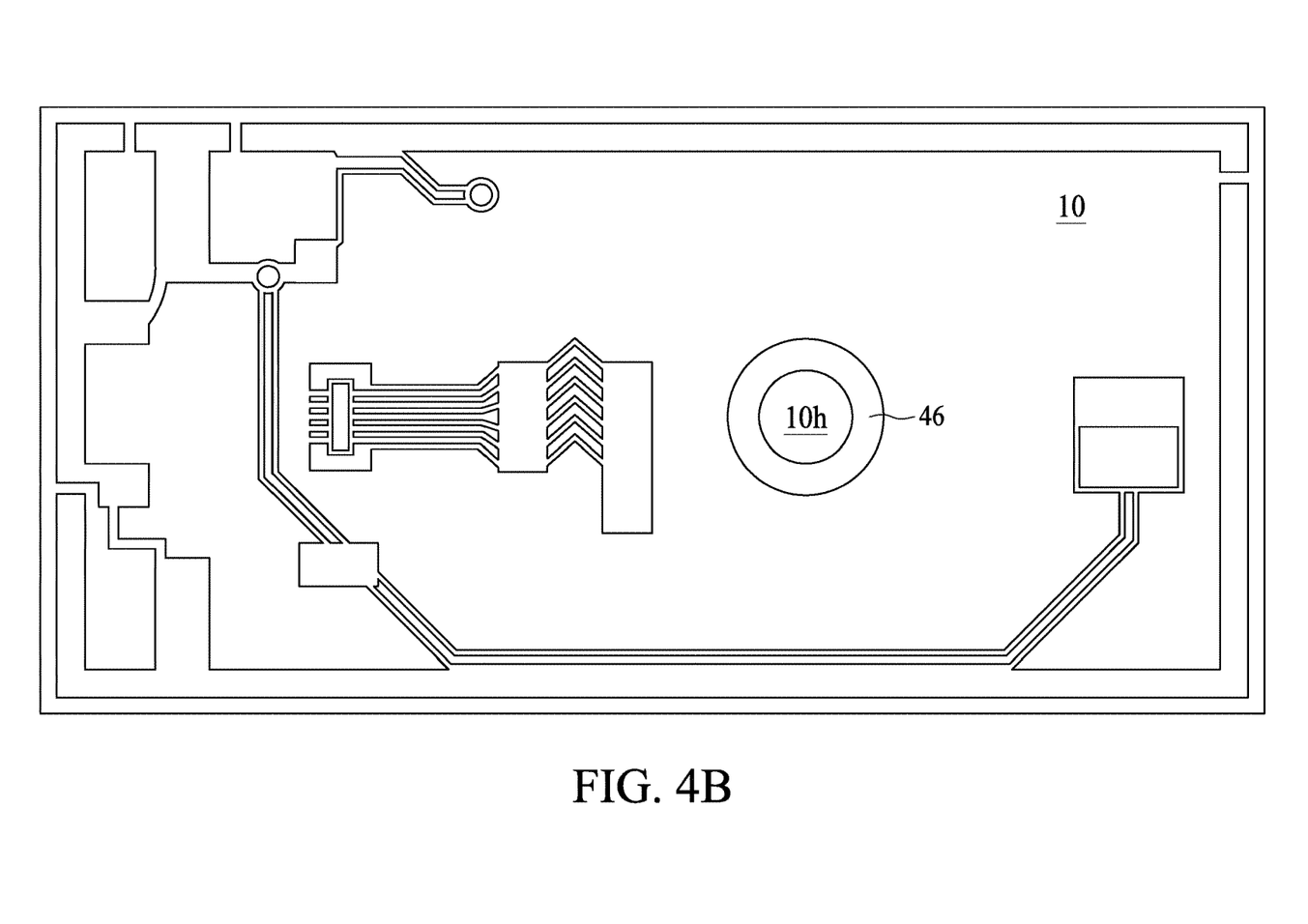
FIG. 4B illustrates a bottom perspective view of a semiconductor package device in accordance with some embodiments of the present disclosure.

FIG. 4A illustrates a semiconductor package device 4 in accordance with some embodiments of the present disclosure. The semiconductor package device 4 is similar to the semiconductor package device 2 shown in FIG. 2A except that the stage 46 of the semiconductor package device 4 is formed of epoxy and formed by inkjet dispensing. The attachment element 42 is disposed between the MEMS 11 and the stage 46. As shown in FIG. 4B, which illustrates a bottom view of the semiconductor package device 4 in FIG. 4, the stage 46 surrounds the opening 10h of the substrate 10. In some embodiments, the stage 46 may be in a shape of, e.g., a circle or a square.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In some embodiments, two surfaces can be deemed to be coplanar or substantially coplanar if a displacement between the surfaces is small, such as no greater than 1 μm, no greater than 5 μm, or no greater than 10 μm.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a substrate defining an opening penetrating the substrate;
a microelectromechanical systems (MEMS) device having an active surface facing away from the substrate and a sensing region facing toward the opening;
an attachment element disposed on the substrate and surrounding the opening and the sensing region of the MEMS device;
a die disposed on the substrate;
a package body covering the die and exposing the MEMS device; and
a metal lid disposed on the package body, wherein the metal lid defines an opening exposing the MEMS device,
wherein the attachment element includes a B-stage silicon soft adhesive material, and
the package body defines a cavity to accommodate the MEMS device, and a sidewall of the cavity includes a protrusion portion.

2. An electronic device, comprising:
a substrate having a first surface and a second surface opposite to the first surface, the substrate defining an opening penetrating the substrate and a recess on the first surface of the substrate;
a microelectromechanical systems (MEMS) device having an active surface facing away from the substrate and a sensing region facing toward the opening; and
an attachment element surrounding the opening and the sensing region of the MEMS device, wherein a portion of the attachment element is within the recess.

3. The electronic device of claim 2, wherein the sensing region is substantially aligned with the opening.

4. The electronic device of claim 2, further comprising:
a die disposed on the substrate;
a package body covering the die and exposing the MEMS device; and
a metal lid disposed on the package body, wherein the metal lid defines an opening exposing the MEMS device.

5. The electronic device of claim 4, wherein the package body defines a cavity to accommodate the MEMS device, and a sidewall of the cavity includes a protrusion portion.

6. An electronic device, comprising:
a substrate defining an opening penetrating the substrate;
a microelectromechanical systems (MEMS) device having an active surface facing away from the substrate and a sensing region facing toward the opening;
a support bar disposed between the MEMS device and the substrate, the support bar surrounding the opening of the substrate; and
an attachment element surrounding the support bar.

7. The electronic device of claim 6, wherein a portion of the attachment element is between the support bar and the MEMS device.

8. The electronic device of claim 6, where the sensing region is substantially aligned with the opening.

9. The electronic device of claim 6, further comprising:
a die disposed on the substrate;
a package body covering the die and exposing the MEMS device; and
a metal lid disposed on the package body, wherein the metal lid defines an opening exposing the MEMS device.

10. The electronic device of claim 9, wherein the package body defines a cavity to accommodate the MEMS device, and a sidewall of the cavity includes a protrusion portion.

* * * * *